United States Patent
Furmidge

(10) Patent No.: US 7,107,030 B1
(45) Date of Patent: *Sep. 12, 2006

(54) TRANSMITTER AND A MODULATOR THEREFOR

(75) Inventor: Simon Furmidge, Surrey (GB)

(73) Assignee: Nokia Mobile Phones Limited, Espoo (FI)

( * ) Notice: Subject to any disclaimer, the term of this patent is extended or adjusted under 35 U.S.C. 154(b) by 1028 days.

This patent is subject to a terminal disclaimer.

(21) Appl. No.: 09/599,948

(22) Filed: Jun. 23, 2000

(30) Foreign Application Priority Data

Jun. 24, 1999  (GB) ................................. 9914750.6

(51) Int. Cl.
*H04B 1/06* (2006.01)

(52) U.S. Cl. .................. 455/232.1; 455/91; 455/127.2; 455/234.1; 455/240.1; 455/245.1; 455/249.1; 455/247.1

(58) Field of Classification Search ........ 455/118–127, 455/73, 326, 319, 112, 84, 85–88, 317, 318–323, 455/330, 234.1–234.2, 232.1, 246.1, 251.1, 455/253.1, 91, 236.1, 240.1, 241.1, 245.1, 455/245.2, 247.1, 250.1, 249.1, 255, 257–259, 455/264–265, 39; 327/413, 116, 355, 356; 330/252–257, 278, 288

See application file for complete search history.

(56) References Cited

U.S. PATENT DOCUMENTS

| | | | |
|---|---|---|---|
| 3,983,489 A | 9/1976 | Gittinger | |
| 4,282,497 A * | 8/1981 | Hulbert | 332/124 |
| 4,704,738 A | 11/1987 | Graziadei et al. | 455/253 |
| 5,081,670 A * | 1/1992 | Reum | 379/28 |
| 5,113,094 A | 5/1992 | Grace | |
| 5,212,814 A * | 5/1993 | Iwane | 455/107 |
| 5,252,866 A * | 10/1993 | Kimura | 455/333 |
| 5,355,534 A | 10/1994 | Kimura | |
| 5,552,734 A | 9/1996 | Kimura | |
| 5,568,098 A * | 10/1996 | Horie et al. | 331/16 |
| 5,900,781 A | 5/1999 | Igarashi et al. | 330/254 |
| 5,933,448 A * | 8/1999 | Katisko | 375/219 |
| 5,933,767 A * | 8/1999 | Leizerovich et al. | 455/126 |
| 5,946,607 A * | 8/1999 | Shiino et al. | 455/234.1 |
| 5,970,390 A * | 10/1999 | Koga et al. | 455/42 |
| 5,978,661 A * | 11/1999 | Caspers et al. | 455/110 |
| 5,982,233 A * | 11/1999 | Hellmark et al. | 330/149 |
| 5,983,082 A * | 11/1999 | Hilbert | 455/76 |

(Continued)

FOREIGN PATENT DOCUMENTS

GB    2332796    6/1999

OTHER PUBLICATIONS

Takafumi Yamaji et al, "A 2GHz Balanced Harmonic Mixer for Direct-Conversion Receivers": IEEE Custom Integrated Circuits Conference; May 5, 1997; pp. 193-196.

(Continued)

*Primary Examiner*—Pablo N. Tran
(74) *Attorney, Agent, or Firm*—Harrington & Smith, LLP

(57) ABSTRACT

A transmitter for a portable radio communication apparatus comprising a modulator having first port for inputting a baseband signal and a second port for inputting a local oscillator signal, and including means for rectifying the input local oscillator signal to provide a conductance waveform at a multiple of the local oscillator signal, and means for mixing the baseband signal with the conductance waveform at said multiple of the local oscillator signal frequency for up-converting the baseband signal to a radio frequency modulated carrier, the transmitter including means for controlling the gain of the modulator thereby to control the output level of the modulator.

12 Claims, 2 Drawing Sheets

U.S. PATENT DOCUMENTS

| | | | |
|---|---|---|---|
| 6,018,270 A * | 1/2000 | Stuebing et al. ............. | 330/278 |
| 6,026,286 A * | 2/2000 | Long ......................... | 455/327 |
| 6,081,727 A * | 6/2000 | Kondo ....................... | 455/522 |
| 6,094,571 A * | 7/2000 | Groe .......................... | 455/333 |
| 6,111,463 A * | 8/2000 | Kimura ....................... | 330/254 |
| 6,205,325 B1 * | 3/2001 | Groe .......................... | 455/333 |
| 6,215,986 B1 * | 4/2001 | Green ......................... | 455/126 |
| 6,215,989 B1 * | 4/2001 | Otaka ....................... | 455/234.1 |
| 6,236,848 B1 * | 5/2001 | Igarashi et al. ............. | 455/341 |
| 6,246,864 B1 * | 6/2001 | Koike ........................ | 455/110 |
| 6,253,092 B1 * | 6/2001 | Nguyen et al. ............. | 455/522 |
| 6,255,912 B1 * | 7/2001 | Laub et al. .................. | 331/25 |
| 6,259,901 B1 * | 7/2001 | Shinomiya et al. ...... | 455/127.3 |
| 6,304,139 B1 * | 10/2001 | Kanno ....................... | 330/133 |
| 6,345,173 B1 * | 2/2002 | Fourtet et al. ................ | 455/76 |
| 6,397,044 B1 * | 5/2002 | Nash et al. ................... | 455/73 |
| 6,404,263 B1 * | 6/2002 | Wang ......................... | 327/359 |
| 6,526,265 B1 * | 2/2003 | Damgaard et al. .......... | 455/118 |
| 6,549,761 B1 * | 4/2003 | Kim ....................... | 455/127.1 |
| 6,556,814 B1 * | 4/2003 | Klomsdorf et al. ......... | 455/121 |
| 6,633,751 B1 * | 10/2003 | Damgaard et al. .......... | 455/126 |
| 6,658,237 B1 * | 12/2003 | Rozenblit et al. ............. | 455/83 |

OTHER PUBLICATIONS

Ian Hickman, "LTPs and active double balanced mixers"; vol. 99, Electronics World and Wireless World; Feb. 1993, pp. 126-128.

* cited by examiner

TRANSMITTER AND A MODULATOR THEREFOR

BACKGROUND OF THE INVENTION

The present invention relates to a transmitter for a portable radio communication apparatus, and more particularly to a modulator for a direct conversion transmitter.

A general trend in portable communication apparatus is the reduction in volume, weight and power consumption of such apparatus. This has led to efforts towards reducing the number of elements and devices necessary to perform the functions associated with portable communication devices. In particular, the radio frequency transmit strip of portable communication apparatus, which typically comprises a number of up-converting stages, is an area in which a reduction in the number of elements and devices would be beneficial.

One approach to reduce the number of stages in the radio frequency transmit strip is to convert a baseband signal (comprising the information to be transmitted) to a radio frequency carrier signal in a single step. This is termed direct conversion or direct modulation. To carry out direct conversion, a local oscillator signal (LO) having the same frequency as the required radio frequency carrier signal is mixed with the baseband signal in a suitable non-linear device such as a mixer diode. The output of the mixer contains the sum and difference of the LO and the baseband signal. In this way, the LO signal is modulated by the baseband signal.

Typically, the baseband signal comprises 'I' and 'Q' components and accordingly two such modulators with their outputs summed together are required. These are fed with two LO signals, the 'Q' component LO having a 90 degree phase shift with respect to the 'I' component.

Therefore, one of the issues with direct conversion transmitter design is that of generating the 90 phase shift for the 'Q' LO signal. At present, there are two commonly used methods: one is a passive phase shift network using reactive elements, the other is an active divide-by-two circuit. The passive phase shift network approach involves the design of a frequency selective 'All Pass' filter network to provide the phase difference between the 'I' and 'Q' local oscillators but has the disadvantage that it is inherently limited to substantially narrow band applications and also that it can be difficult to integrate such networks onto an IC. The divide-by-two approach uses a pair of dividers one clocked off the rising and one off the falling edge of an LO at double the wanted operating frequency. The active divide-by-two circuit has the disadvantage that it requires high current to operate and requires an LO of double the frequency of operation. For example, if the wanted operating frequency were say 1.9 GHz then an LO of 3.8 GHz would be required to drive this circuit. Hence, a synthesizer and divide-by-two operating at 3.8 GHz would consume a great deal of current. Since the trend in portable communication devices is towards compactness there is less space for battery packs, and thus less battery capacity is available and so low current operation becomes increasingly important to achieve acceptable talk and standby times.

A separate issue, but one that is also important in the design of a direct conversion transmitter, is that of the gain control of the transmitter. In certain radio telephone systems such as WCDMA the transmitter is required to vary its output power over a very wide range e.g. 70 dB for WCDMA. Additionally, a direct conversion transmitter must obtain all of its control range at radio frequencies. Thus, since the LO is operating at the wanted radio frequency, problems of LO leakage and shielding can become very significant. Conventionally, with one or more IFs, variable gain amplifiers and/or attenuators are distributed between the RF and intermediate frequency (baseband) and used to vary the transmitter power. These approaches however have not satisfactorily provided the wide range of power control required.

A further concern with direct conversion transmitters is that the LO signal cannot be provided directly from a synthesiser locked VCO. There are two main reasons why. Firstly, if the radiotelephone has an internal antenna there is a very great risk that the transmitter will radiate back into the synthesiser locked VCO and cause it to go out of lock or generate spurious signals. Secondly, there will be insufficient isolation between antenna impedance (which will vary a great deal as the user moves around) and the synthesiser locked VCO. This will cause the synthesiser locked VCO to either go out of lock or generate spurious signals. One method of solving this problem is to create the LO signal by mixing together two synthesiser locked VCO signals and then filtering the LO to remove any unwanted mixing products. This however, increases component count and current consumption.

SUMMARY OF THE INVENTION

Against this background, and in one aspect, the present invention provides a transmitter for a portable radio communication apparatus comprising a modulator having first port for inputting a baseband signal and a second port for inputting a local oscillator signal, and including means for rectifying the input local oscillator signal to provide a conductance waveform at a multiple of the local oscillator signal, and means for mixing the baseband signal with the conductance waveform at said multiple of the local oscillator signal frequency for up-converting the baseband signal to a radio frequency modulated carrier, the transmitter including means for controlling the gain of the modulator thereby to control the output level of the modulator.

By means of the invention, the baseband signal can be up-converted without employing a local oscillator at the carrier frequency of the transmitted signal, and the output of the modulator can be varied.

The local oscillator can be fixed to operate at a sub-harmonic of the transmitted signal frequency, and the mixing action is performed between the baseband signal and one of the harmonics of the local oscillator, which advantageously ensures that the harmonic is not generated in the transmitter. This is termed sub-harmonic mixing. Accordingly, the local oscillator signal frequency is far removed from transmitted signal frequency, resulting in the mixer providing very high local oscillation to transmitted signal isolation.

A further advantage is that the high local oscillator isolation allows the output level of the modulator to be controlled over a large range before local oscillator breakthrough becomes a problem.

The modulator output may be controlled by means of controlling the current through the modulator circuit.

The LO signal advantageously requires only a single ended drive, resulting in lower current consumption and component count.

In a preferred embodiment of the present invention, the modulator comprises two cross-coupled pairs of switching elements in the form of two cross connected long tail pairs of bipolar transistors, wherein a signal input modulates the switching elements at a multiple of the local oscillator frequency.

Advantageously, the switching elements use substantially identical devices and in a preferred arrangement provide a high degree of balance. This further improves isolation between the radio frequency and local oscillator ports, allowing still greater control range of the output level. The use of substantially identical switching devices facilitates their integration into an integrated circuit.

For this application of direct conversion transmitter the local oscillator is half the transmitted frequency.

The present invention extends to apparatus for a sub-harmonic mixer, comprising switching means, a first port for inputting a baseband signal to the switching means to be up-converted, and a second port for inputting a local oscillator signal to drive the switching means at an even multiple of the local oscillator frequency for up-converting the baseband signal to transmission frequency.

The mixer further includes means for controlling the output level of the up-converted the baseband signal.

An advantageous feature of the mixer disclosed herein is that it is bi-directional.

The invention further includes methods for performing the modulating defined herein.

BRIEF DESCRIPTION OF THE DRAWINGS

Specific embodiments in accordance with the invention are hereinafter described, by way of example only, and with reference to the accompanying drawings, in which.

DETAILED DESCRIPTION OF THE INVENTION

Figure 1:
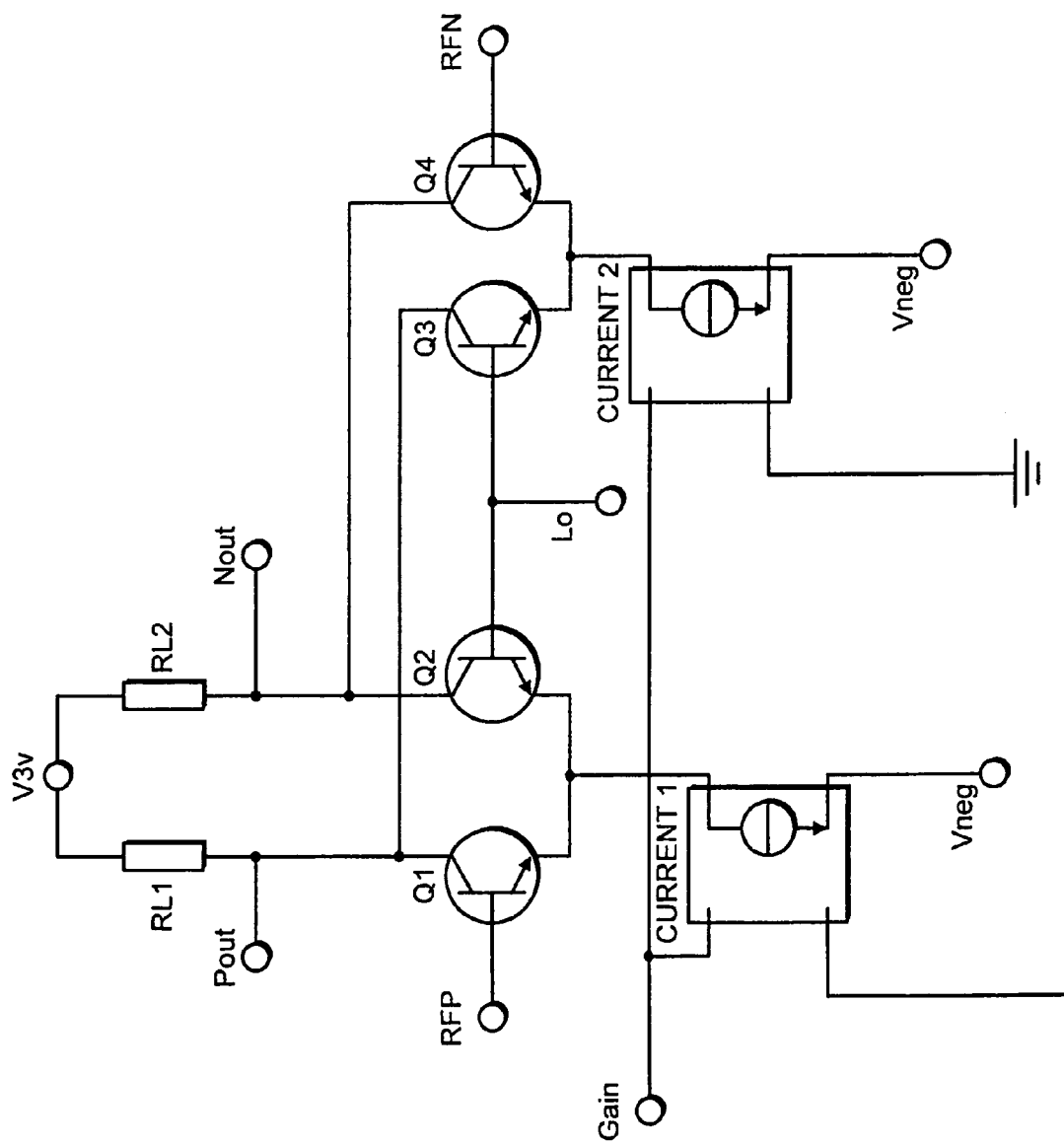
FIG. 1 is a schematic circuit diagram of a preferred embodiment in accordance with the present invention.

Referring initially to FIG. 1 there is shown an exemplary modulator circuit diagram of the present invention. In this circuit a suitable power supply is connected at V3v ie. 3 volts. The power supply V3v is connected to the output loads of the modulator circuit, the load being represented by resistors RL1 and RL2. These however may be reactive, resistive or active whichever is most suitable in the application. The output loads RL1 and RL2 are connected respectively to Pout and Nout which are the differential outputs of the modulator circuit. The signal present between Pout and Nout is the modulated radio frequency carrier. In the case of an 'I/Q' modulator this differential output would be summed with the differential output of a second modulator. The summed output would then be passed to the next stage of the transmitter.

Pout and Nout are coupled to the transistor network forming the switching means of the modulator circuit. The transistors Q1,2,3,4 are shown as bipolar junction transistors, but could be FETs or the like. Q1 and Q2 form a long tail pair as do Q3 and Q4. The collectors of Q1 and Q3 are connected to Pout, and the collectors of Q2 and Q4 are connected to Nout. RFP is connected to the base of Q1 and RFN is connected to the base of Q4; RFP and RFN provide the differential inputs to the switching means, whereby the I or Q baseband signals can be injected differentially into these ports.

Lo designates the local oscillator input port and this is connected to the bases of Q2 and Q3. This will cause the switching means to operate at twice the frequency of input.

The emitters of each pair of long tail pairs of transistor network Q1 to Q4 are connected to a gain control means which controls the current through the transistor network. The gain control means comprises two current controllers labelled Current 1 and Current 2, and the level labelled Gain is an input to the current controllers whereby the current in both the pairs of long tail pairs may be increased or decreased. Vneg may be connected to ground or a suitable positive or negative power supply.

The operation of the circuit will now be described.

The current controller operates to hold the total current through the Q1, Q2 and Q3,Q4 pairs constant, if the voltage on RFP and RFN is held constant for instance, the local oscillator signal on Lo as it becomes more positive will increase the current flow in Q2 and Q3 thus reducing the current flow in Q1 and Q4. When the local oscillator signal is lower in voltage than RFP and RFN, Q2 and Q3 will have much less current flowing in them than 01 and 04. When the local oscillator voltage is the same as RFP, Q1 and Q2 and also Q3 and Q4 will have the same current flowing in them. When the local oscillator voltage is greater than the voltage on RFP and RFN Q2 and Q3 will have more current flowing in them than Q1 and Q4.

As shown in the embodiment of FIG. 1, the collectors of Q1 and Q3, Q2 and Q4 are connected together. Based on the description above, with RFP and RFN held at the same constant voltage, the current in Q1/Q4 will decrease at the same rate as the current in Q2/Q3 increases as the Lo voltage increases. Thus the voltage at Pout and Nout will remain constant. If the Local oscillator signal on Lo is larger in amplitude than Vbe i.e. 0.7 volts, it will completely switch Q2 and Q3 on and off. This is the desired mode of operation. The output pulses will then be of an amplitude defined solely by the amplitude of the differential signal applied between RFP and RFN and the gain defined by the current control means.

If a constant offset voltage is applied between RFP and RFN it will change the point on the Lo waveform where Q3 switches on relative to Q2. As Q3's collector is cross coupled to Q1's collector, if Q2 switches later than Q3 then the current flow in Q3 will increase before the current flow in Q1 reduces. Thus an increase in current flow will be seen in RL1 and because Q4's collector is coupled to Q2s a corresponding reduction in current flow in RL2 will be seen. This will result in a voltage pulse between Pout and Nout. This effect occurs on both the rising and falling edges of the local oscillator signal. Thus the mixing effect takes place at twice the local oscillator frequency.

Figure 2:
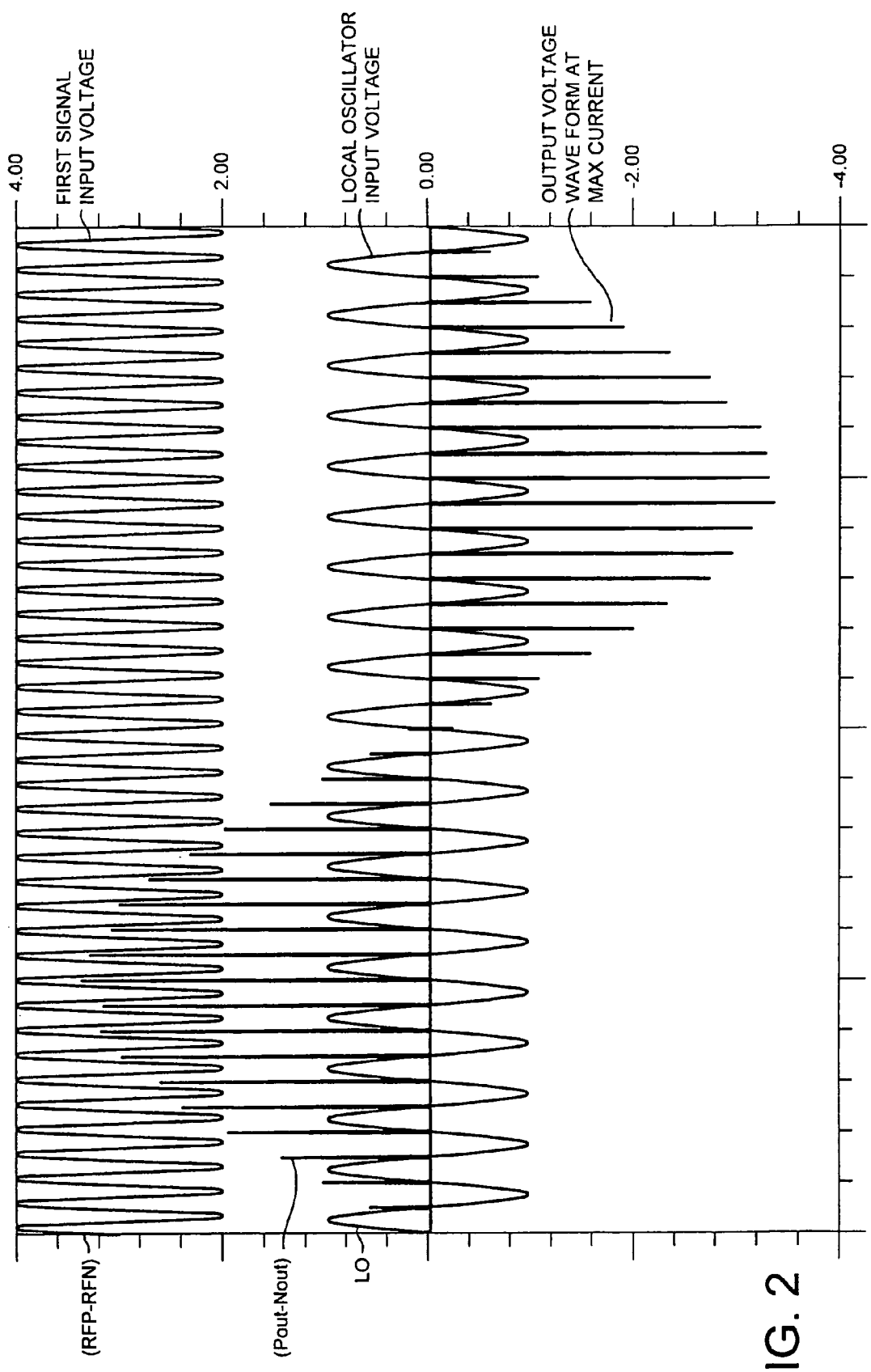
FIG. 2 schematically shows the voltage waveforms of the local oscillator and first signal input ports of the embodiment of FIG. 1.

Referring to FIG. 2, this shows the operation of the sub-harmonic mixer with an input signal of 4.1 MHz with an Lo of 2 Mhz. This demonstrates its mode of operation.

As can be seen from the Lo and output waveforms, the output pulses occur, in this case, at the zero crossing points of the Lo. The output pulses if referenced to the first input signal have a amplitude that is proportional to the amplitude of the first input signal at that point in time. The ratio of the first input signal amplitude to the amplitude of the Output voltage (Gain) is determined by the current flow in the Q1,2 and Q2,3 long-tail pairs. This current flow is determined by the current control means in the emitters of the Q1,2 and Q3,4 long tail pairs.

The present invention may be embodied in other specific forms without departing from its essential attributes. The switching means shown as bipolar transistors may be replaced with suitable FETs or other forms of voltage or current controlled switches. Accordingly reference should be made to the appended claims and other general statements herein rather than to the foregoing specific description as indicating the scope of invention.

Furthermore, each feature disclosed in this specification (which term includes the claims) and/or shown in the drawings may be incorporated in the invention independently of other disclosed and/or illustrated features. In this regard, the invention includes any novel features or combination of features disclosed herein either explicitly or any generalization thereof irrespective of whether or not it relates to the claimed invention or mitigates any or all of the problems addressed.

The appended abstract as filed herewith is included in the specification by reference.

What is claimed is:

1. A transmitter for a portable radio communication apparatus comprising:
a modulator including a first port for inputting a baseband signal, a second port for inputting a local oscillator signal, means for rectifying the input local oscillator signal to provide a conductance waveform at a multiple of the local oscillator and means for mixing the baseband signal with the conductance waveform at said multiple of the local oscillator signal frequency for up-converting the baseband signal to a radio frequency modulated carrier; and
means for controlling the gain of the modulator thereby to control the output level of the modulator.

2. A transmitter according to claim 1, wherein: a local oscillator signal drives the modulator at a multiple of its frequency.

3. A transmitter according to claim 1, wherein:
the means for controlling the gain of the modulator comprises current control means.

4. A transmitter according to claim 1, wherein:
the modulator comprises two cross-coupled pairs of switching elements, wherein a signal input modulates the switching elements at a multiple of the local oscillator frequency.

5. A transmitter according to claim 4, wherein:
said two cross-coupled pairs of switching elements comprise two cross connected long tail pairs of bipolar transistors.

6. A transmitter according to claim 1, wherein the means for controlling the gain of the modulator comprises controlling current through the modulator.

7. A transmitter of a portable radio communication apparatus comprising:
a modulator including a switching circuit, a first port for input of a baseband signal and a second port for input of a local oscillator signal to the switching circuit which provides a conductance waveform at a frequency multiple of an oscillation frequency of the local oscillator signal, and a mixer which mixes the baseband signal with the conductance waveform at the frequency multiple of the local oscillator signal frequency for up-converting the baseband signal to a radio frequency modulated carrier; and
gain control means, coupled to the modulator, for controlling gain of the modulator to control the output level of the modulator.

8. A transmitter according to claim 7, wherein:
the local oscillator signal drives the switching circuit at a multiple of a frequency of the local oscillator.

9. A transmitter according to claim 7, wherein: the gain control means comprises a current control.

10. A transmitter according to claim 7, wherein the switching circuit of the modulator comprises:
two cross-coupled pairs of switching elements, wherein the local oscillator signal modulates the switching elements at the frequency multiple of the local oscillator frequency.

11. A transmitter according to claim 10, wherein: the two cross-coupled pairs of switching elements comprise two cross connected long tail pairs of bipolar transistors.

12. A transmitter according to claim 7, wherein the gain control means controls the gain of the modulator by controlling current through the modulator.

* * * * *